United States Patent [19]

Russell

[11] 4,052,228
[45] Oct. 4, 1977

[54] OPTICAL CONCENTRATOR AND COOLING SYSTEM FOR PHOTOVOLTAIC CELLS

[76] Inventor: Charles R. Russell, 3071 Marilyn Way, Santa Barbara, Calif. 93105

[21] Appl. No.: 704,328

[22] Filed: July 12, 1976

[51] Int. Cl.² ............................................. H01L 31/04
[52] U.S. Cl. ................................................. 136/89 PC
[58] Field of Search ................ 136/89 PC; 126/270, 126/271

[56] References Cited
U.S. PATENT DOCUMENTS

| | | |
|---|---|---|
| 2,402,662 | 6/1946 | Ohl .................................. 136/89 |
| 2,946,945 | 7/1960 | Regnier et al. ................. 136/89 X |
| 3,988,166 | 10/1976 | Beam .................................. 136/89 |
| 4,021,323 | 5/1977 | Kilby et al. ........................ 204/129 |

Primary Examiner—Donald L. Walton
Assistant Examiner—Aaron Weisstuch

[57] ABSTRACT

An optical concentrator and cooling system in which a photovoltaic cell array is immersed in a liquid inside an elongated tube having a curved transparent wall for incident radiation, said liquid having a refractive index suitable for concentrating the incident radiation onto the photovoltaic cell array.

5 Claims, 6 Drawing Figures

OPTICAL CONCENTRATOR AND COOLING SYSTEM FOR PHOTOVOLTAIC CELLS

BACKGROUND OF THE INVENTION

This invention relates to a means for reducing the cost of electrical energy from photovoltaic cells. These cells are remarkable energy sources having no moving parts and a lifetime of many years when suitably protected. However photovoltaic cells are very expensive. As a result, their applications have been limited to space power systems and to a few special terrestial applications.

The power that a photovoltaic cell can produce is a function of the insolate sunlight and a typical solar cell can utilize efficiently many times the normal solar insolation, provided that the temperature of the solar cell does not increase excessively. Therefore, a solar concentrator can be effective; and within limits, the electrical output of the photovoltaic cell will increase with the concentration factor. At appreciable concentration factors, cooling is required, since the efficiency of photovoltaic cells may decrease rapidly with increasing temperatures. In fact some silicon solar cells become completely ineffective at temperatures below 200° C.

Many types of solar concentrators have been studied including reflective and refractive devices. The large amount of material in refractive devices of conventional design adds to the cost. The precise construction required for solar concentrators and for the tracking mechanism to point the optical system towards the sun and the requirement for cooling systems have made optical concentrators uneconomical for most applications.

SUMMARY OF THE INVENTION

An optical concentrator and cooling system for photovoltaic cells has been invented which system is effective in concentrating the sunlight and in cooling the cells economically. This new system consists of an elongated tube with a curved transparent area for admitting sunlight. This elongated tube is filled with a clear nonconducting liquid having a refractive index suitable for concentrating the sunlight onto the photovoltaic cells mounted inside the tube and immersed in the liquid. Solar cells have been demonstrated to function satisfactorily when immersed in a clear nonconducting liquid.

Heat from the solar cells is transferred to the tube walls by the clear liquid through convection and conduction. The area of the tube walls is much larger than the area of the solar cells for transferring heat to the surrounding. Also the clear liquid can be recirculated through an external heat exchanger, if additional cooling is necessary for efficient operation. Additional cooling also can be obtained by circulating a cooling fluid through heat exchange surfaces immersed in the clear liquid inside the elongated tube or through external heat exchange surfaces attached to the sides or bottom of the elongated tube.

The lower inside surfaces of the elongated tube can be made reflective and with an orientation and shape to reflect onto the solar cells part of the sunlight entering the top of the tube. The combined reflection from the sides and refraction through the liquid filling the tube can produce the desired concentration of the sunlight onto the solar cells. Reflective surfaces can be placed inside the elongated tube independent of the sides of this tube.

The tube containing the solar cells can be fixed in position or the device can be moved to track the sun so that the insolate solar radiation is normal to the plane of the active surface of the solar cells. An advantage of mounting the solar cells inside an elongated tube is that effective tracking of the sun can be achieved by rotating the tube about its longitudinal axis without the more complicated mechanism required for continual sun tracking in both elevation and azimuth.

An objective of the invention is to provide improved apparatus for concentrating solar energy on a transducer and for cooling the transducer.

Other objectives and many of the attendant advantages of this invention will be readily appreciated as the same becomes better understood by reference to the following description.

DESCRIPTION OF PREFERRED EMBODIMENTS

Figure 1:
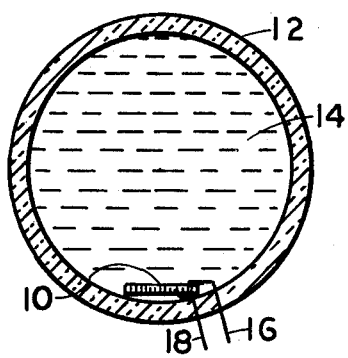
FIG. 1 is a transverse sectionized view of a system.
Figure 2:
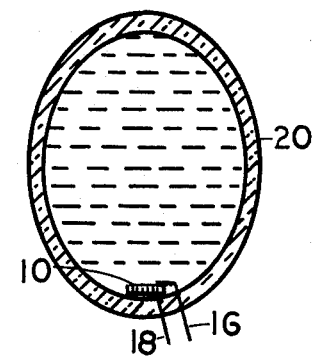
FIG. 2 is a transverse sectionized view of a modified form of a system.
Figure 3:
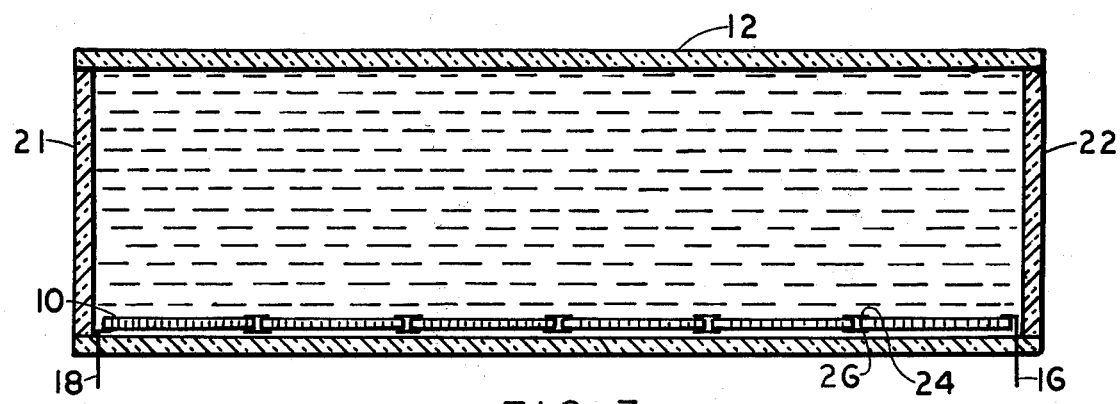
FIG. 3 is a longitudinal sectionized view.

For a more complete understanding of the invention reference may be made to the following description thereof and to the drawings of which FIGS. 1, 2, 4, and 5 are transverse sectionized views of forms of a system, and FIG. 3 is a longitudinal sectionized view. More specifically in FIG. 1 the numeral 12 designates a curved transparent surface of plastic or glass. A clear liquid 14, which is compatible with the other material used in constructing the system, has a refractive index suitable for concentrating the entering sunlight on the photovoltaic cells 10 mounted inside the elongated tube formed at least in part by the curved transparent surface 12. These solar cells 10 are immersed in the liquid 14 for cooling. The electrical energy produced by illumination of the photovoltaic cells 10 is connected to an external load through power leads 16 and 18. The photovoltaic cells are electrically interconnected by connectors such as 24 and 26. The cells may be interconnected in parallel or in series or in some combination of parallel and series so as to provide the desired voltage at power leads 16 and 18. The elongated tube formed at least in part by the curved transparent surface 12 and containing the liquid 14 is closed on the ends by end plates 21 and 22. The curved transparent surface 12 may be coated by a non-reflective coating to reduce reflection of the sunlight striking this surface and thereby increase the amount of sunlight entering the tube. The curved transparent surface may be cylindrical as shown in FIG. 1 or, as shown in FIG. 2, the transparent surface 20 may be eliptical in cross section or some other shape to produce a higher concentration of sunlight on the solar cells 10.

Figure 4:
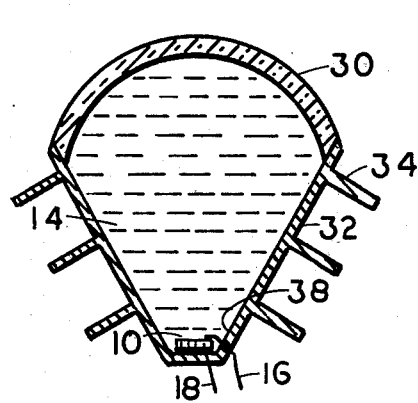
FIG. 4 is a transverse sectionized view of another modified form of a system.
Figure 5:
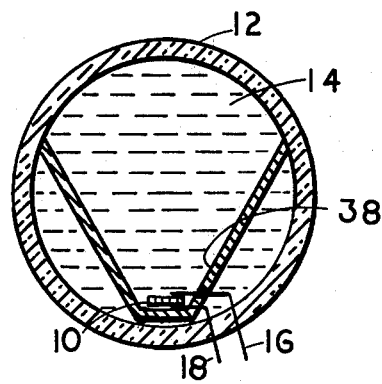
FIG. 5 is a transverse sectionized view of still another modified form of a system.

The lower sides of the elongated tube may have a reflective surface 38 as shown in FIGS. 4 and 5 so that the combined effects of refraction through the curved upper transparent surface and the clear liquid 14 and reflection from the surfaces 38 produce the desired concentration of sunlight on the solar cells. The reflective sides 38 may be flat or curved. The reflective surface 38 may be placed inside the elongated tube as shown in FIG. 5.

Sunlight can be concentrated effectively on the solar cells without image formation. Also bubbles or slightly incomplete filling of the elongated tube with liquid have been found not to reduce significantly the electric power output of the solar cells. The liquid for filling the elongated tube must be clear, electrically nonconducting, low viscosity, and compatible with materials of construction of the system. Also the liquid must have a refractive index suitable for concentrating the entering sunlight on the solar cells. Examples of suitable liquids are water and aliphatic hydrocarbons such as decane or clear mixtures of aliphatic hydrocarbons derived from petroleum. Aromatic hydrocarbons such as benzene and toluene have desirable high indexes of refraction, however many such aromatic hydrocarbons are not compatible with plastics that may be used for the curved transparent surface.

Fins or other extended heat transfer surfaces 34 shown in FIG. 4 may be attached to the lower sides 32 of the elongated tube to increase the rate of heat transfer to surroundings.

Figure 6:
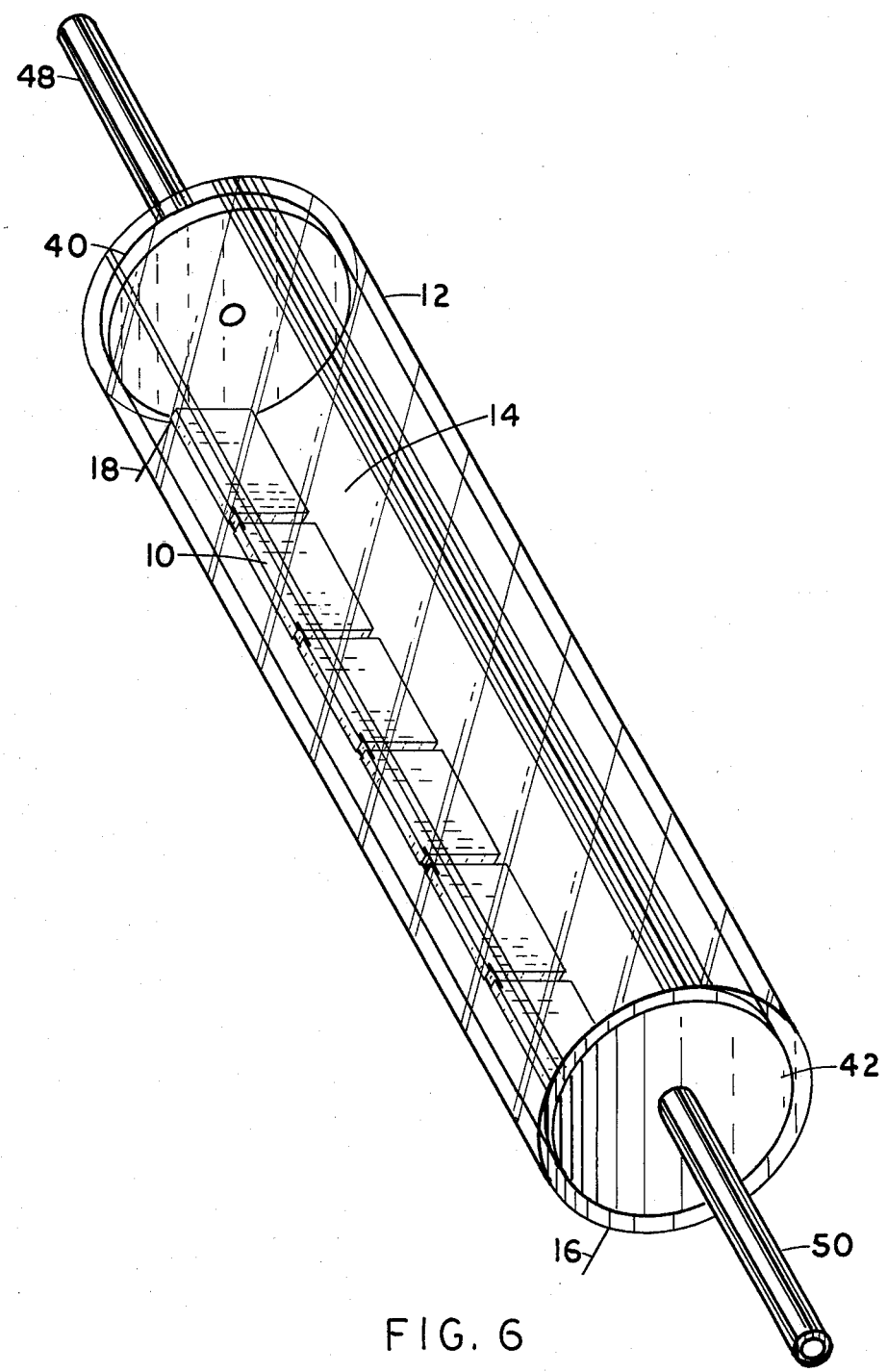
FIG. 6 is a perspective view of transducers in a tube for recirculating a liquid coolant.

FIG. 6 is a perspective view of photovoltaic cells 10 cemented or otherwise fastened inside an elongated tube with inlet and outlet pipes 48 and 50 for circulating a liquid coolant 14 which also refracts the entering sunlight onto the cells 10. The inlet and outlet pipes 48 and 50 are attached to the end plates 40 and 42. These pipes 48 and 50 can be used to support and rotate the device about its longitudinal axis for tracking the sun.

Obviously many modifications and variations of the present invention are possible in the light of the above teachings. It is therefore to be understood that within the scope of the appended claims the invention may be practiced otherwise than as specifically described.

What is claimed is:
1. Apparatus for converting solar radiation to electrical energy comprising:
   1. a plurality of solar cells;
   2. a tube of elliptical cross section, comprising a transparent wall section having elliptical inner and outer wall surfaces, said solar cells being secured to an inner wall of said tube near one end of the major axis of the elliptical shape opposite said transparent wall section;
   3. a liquid surrounding said cells and substantially filling said tube whereby radiation impinging on said transparent wall section is concentrated on said cells through the curved surface of said liquid.
2. The apparatus of claim 1 wherein said tube comprises a transparent curved wall section and a radiation reflecting section whereby radiation entering said tube but not refracted directly to said cells is reflected to said cells.
3. The apparatus of claim 2 wherein said reflecting section is a metal.
4. The apparatus of claim 3 comprising in addition cooling fins secured to said metal.
5. The apparatus of claim 1 comprising in addition reflector surfaces disposed inside said tube effective to concentrate incoming radiation to said cells.

* * * * *